US012772577B2

(12) United States Patent
Zanatta

(10) Patent No.: US 12,772,577 B2
(45) Date of Patent: Oct. 20, 2026

(54) MACHINE FOR PRODUCING AN ELECTRODE

(71) Applicant: FLY SOLARTECH SOLUTIONS S.R.L., San Daniele del Friuli (IT)

(72) Inventor: Davide Zanatta, San Daniele del Friuli (IT)

(73) Assignee: FLY SOLARTECH SOLUTIONS S.R.L., San Daniele del Friuli (IT)

(*) Notice: Subject to any disclaimer, the term of this patent is extended or adjusted under 35 U.S.C. 154(b) by 0 days.

(21) Appl. No.: 18/554,842

(22) PCT Filed: Apr. 13, 2022

(86) PCT No.: PCT/IT2022/050098
§ 371 (c)(1),
(2) Date: Oct. 11, 2023

(87) PCT Pub. No.: WO2022/219663
PCT Pub. Date: Oct. 20, 2022

(65) Prior Publication Data

US 2024/0194810 A1 Jun. 13, 2024

(30) Foreign Application Priority Data

Apr. 13, 2021 (IT) ........................ 102021000009254

(51) Int. Cl.

| | |
|---|---|
| ***H10F 19/90*** | (2025.01) |
| ***B29C 53/56*** | (2006.01) |
| ***H10F 71/00*** | (2025.01) |
| ***H10F 77/20*** | (2025.01) |

(52) U.S. Cl.
CPC ......... *H10F 19/904* (2025.01); *B29C 53/562* (2013.01); *H10F 71/00* (2025.01); *H10F 77/211* (2025.01)

(58) Field of Classification Search
None
See application file for complete search history.

(56) References Cited

U.S. PATENT DOCUMENTS

| | | | | |
|---|---|---|---|---|
| 728,183 A * | 5/1903 | Varley | ..................... | B29C 53/60 29/605 |
| 2018/0083152 A1 | 3/2018 | Yoshikawa | | |
| 2019/0131466 A1* | 5/2019 | Dotta | .................... | H01L 31/048 |

FOREIGN PATENT DOCUMENTS

| | | |
|---|---|---|
| EP | 1547158 | 11/2007 |

OTHER PUBLICATIONS

International Search Report filed in PCT/IT2022/050098 mailed Aug. 19, 2022.

* cited by examiner

*Primary Examiner* — Barbara J Musser
(74) *Attorney, Agent, or Firm* — RANKIN, HILL & CLARK LLP

(57) ABSTRACT

A machine and method for producing an electrode which can be used to electrically connect two or more photovoltaic cells to each other includes a support layer, an adhesive layer, provided on a surface for positioning said support layer, and a plurality of conductive wires applied onto said adhesive layer.

2 Claims, 4 Drawing Sheets

MACHINE FOR PRODUCING AN ELECTRODE

FIELD OF THE INVENTION

Embodiments described here concern a machine and a method for producing a film electrode which is subsequently applied onto a photovoltaic cell or is applied onto two or more photovoltaic cells to connect them together in order to define a corresponding photovoltaic module.

BACKGROUND OF THE INVENTION

It is known that to produce a photovoltaic module, a plurality of photovoltaic cells are electrically connected to each other so that the electrical energy generated can be conveyed and made usable.

Commonly used photovoltaic cells comprise a semiconductor element with a junction of the ($n^+n$(o p)$p^+$) type, based on mono- or multi-crystalline silicon, amorphous silicon and other thin-film semiconductors with a built-in pn junction. One surface of the element is usually covered with a metallic layer, such as aluminum or silver, while the other surface is equipped with an anti-reflective coating. Both surfaces are in contact with electrodes, which collect and transport the generated electrical energy.

Traditionally, the electrodes are made by heat-welding the conductive wires onto the cell busbars. However, this technology is limiting because a machine can only weld a limited number of cell types; for example, traditional machines can weld from 5 to 9 busbars. In the case of cells with a higher number of busbars, it is necessary to use a machine that welds from 9 to 12, and so on.

Electrodes are also known for connecting to each other film-type cells, for example produced in the form of a continuous strip, and comprise an insulating film, or layer, onto which a layer of adhesive/glue is applied which keeps a plurality of conductive wires in position according to a determinate layout.

The conductive wires are covered with a coating made of a low melting point alloy, and they are pressed inside the adhesive layer in such a way as to be immersed in it almost completely, or in any case for a good part.

During the application of the conductive wires onto the adhesive layer present on the film, the assembly is simultaneously pressed and heated to a temperature equal to approximately the softening temperature of the adhesive so that, after cooling, the conductive wires remain attached to the film.

One disadvantage of this method is that the heating step, during the production of the electrode, is highly energy-intensive and can cause problems of shrinkage between the film and the conductive wires.

Another disadvantage is that the application of heat requires a slowdown of the process for the adhesive material to reach temperature, causing a decrease in the productivity of the corresponding machine.

The machine for producing the electrode is also more complicated to design and manage because it requires parts or components that have to appropriately transmit heat during the step of assembling the wires onto the adhesive film. An example of a machine for producing such an electrode is described in EP 1 547 158 B1.

Another disadvantage of this method is that the heating step, during the production of the electrode, with the subsequent application thereof onto the cell, causes a thermal shock determined by the temperature difference between the cell at ambient temperature and the heated electrode. This can cause shrinkage of the material, deformations and a reduction in the energy efficiency of the cell.

There is therefore the need to perfect a machine and method for producing an electrode that can overcome at least one of the disadvantages of the state of the art.

In particular, one purpose of the present invention is to perfect a machine that allows to produce a film electrode for photovoltaic applications which is simple, has a high hourly productivity and a reduced number of components compared to known machines.

Another purpose of the present invention is to perfect an innovative coupling method between film and conductive wires in order to produce a film electrode which overcomes the problem of shrinkage of the material and reduces the number of steps required to produce it, also eliminating the thermal shock caused by the temperature difference that in traditional applications is configured between the cell and the electrode.

The Applicant has devised, tested and embodied the present invention to overcome the shortcomings of the state of the art and to obtain these and other purposes and advantages.

SUMMARY OF THE INVENTION

The present invention is set forth and characterized in the independent claims. The dependent claims describe other characteristics of the present invention or variants to the main inventive idea.

In accordance with the above purposes, a machine for producing an electrode, which overcomes the limits of the state of the art and eliminates the defects present therein, comprises at least one feed station with a plurality of supports for respective conductive wires able to be unwound in a direction of feed and, downstream, it comprises an assembly station with at least a first reel onto which a first continuous multilayer strip is wound, and a second reel onto which the conductive wires and the first continuous multilayer strip are able to converge in order to form, by winding, the electrode. The first multilayer strip consists of at least one support layer with which there is associated an adhesive layer onto which the conductive wires are cold-glued.

According to one aspect, the first continuous multilayer strip also comprises a protective layer in contact with the adhesive layer. A second continuous multilayer strip is formed on the second reel, comprising the electrode and the protective layer, by sandwiching the conductive wires.

In accordance with some embodiments, a method to produce an electrode is provided. The method comprises at least:

- a feed step in which respective conductive wires wound onto a plurality of supports are unwound in a direction of feed,
- an assembly step in which a first continuous multilayer strip is supplied onto a first reel and is directed toward a second reel to which the conductive wires also converge, which are cold-glued on an adhesive layer that makes up, together with at least one support layer with which it is associated, the first continuous multilayer strip in order to form, by winding, the electrode.

According to one aspect, in the assembly step the first continuous multilayer strip also comprises a protective layer which is temporarily separated from the adhesive layer in order to allow the conductive wires to be glued onto the latter and is subsequently closed on top of them in order to define, by winding, the second multilayer strip.

In accordance with some embodiments, the electrode comprises a support layer, an adhesive layer, supplied on a surface for positioning the support layer, and a plurality of conductive wires applied onto the adhesive layer.

According to one aspect, the adhesive layer is cold-activatable and has a thickness that is smaller, by two orders of magnitude, than the thickness of each conductive wire of the plurality of conductive wires and is smaller, by one order of magnitude, than a thickness of the support layer.

In accordance with some embodiments, a photovoltaic module is provided comprising at least one photovoltaic cell onto which there is cold-applied an electrode as above.

The photovoltaic module is produced with a method that comprises making available at least one photovoltaic cell and cold-applying an electrode as above onto the photovoltaic cell.

DESCRIPTION OF THE DRAWINGS

These and other aspects, characteristics and advantages of the present invention will become apparent from the following description of some embodiments, given as a non-restrictive example with reference to the attached drawings wherein.

Figure 1:
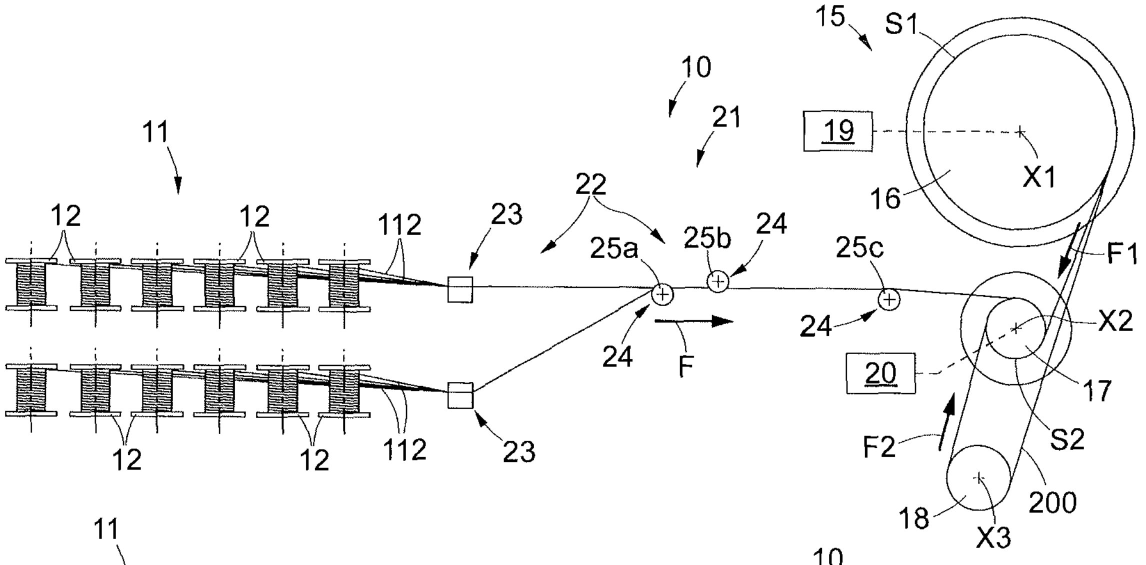
FIG. 1 is a schematic lateral view of a machine for producing an electrode in accordance with some embodiments described here.

To facilitate comprehension, the same reference numbers have been used, where possible, to identify identical common elements in the drawings. It is understood that elements and characteristics of one embodiment can be conveniently combined or incorporated into other embodiments without further clarifications.

DESCRIPTION OF SOME EMBODIMENTS

Figure 8:
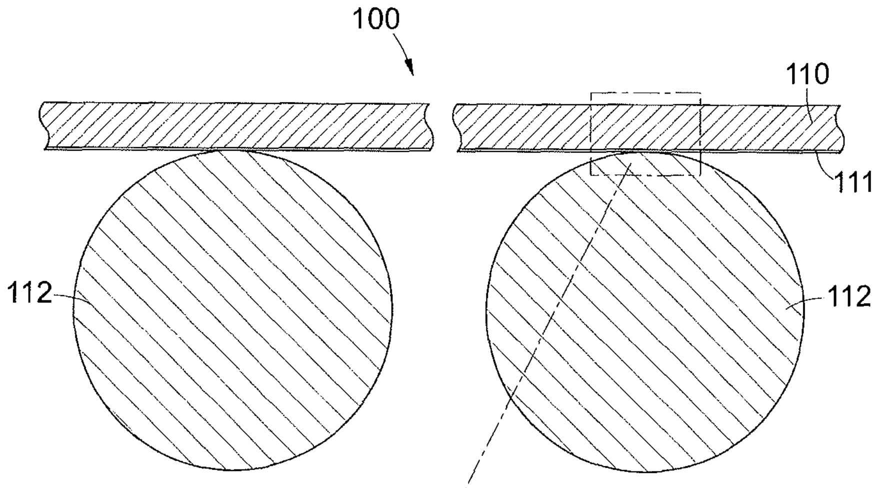
FIG. 8 is an enlarged and interrupted section, according to the plane VIII-VIII of FIG. 7, in which the parts have been moved closer to each other.
Figure 8A:
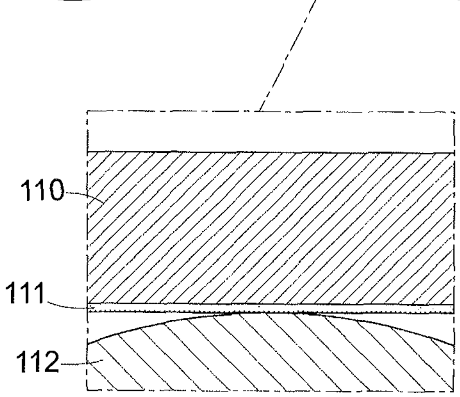
FIG. 8*a* is an enlarged detail of FIG. 8, in which the contact between a conductive wire and the adhesive layer is visible.
Figure 9:
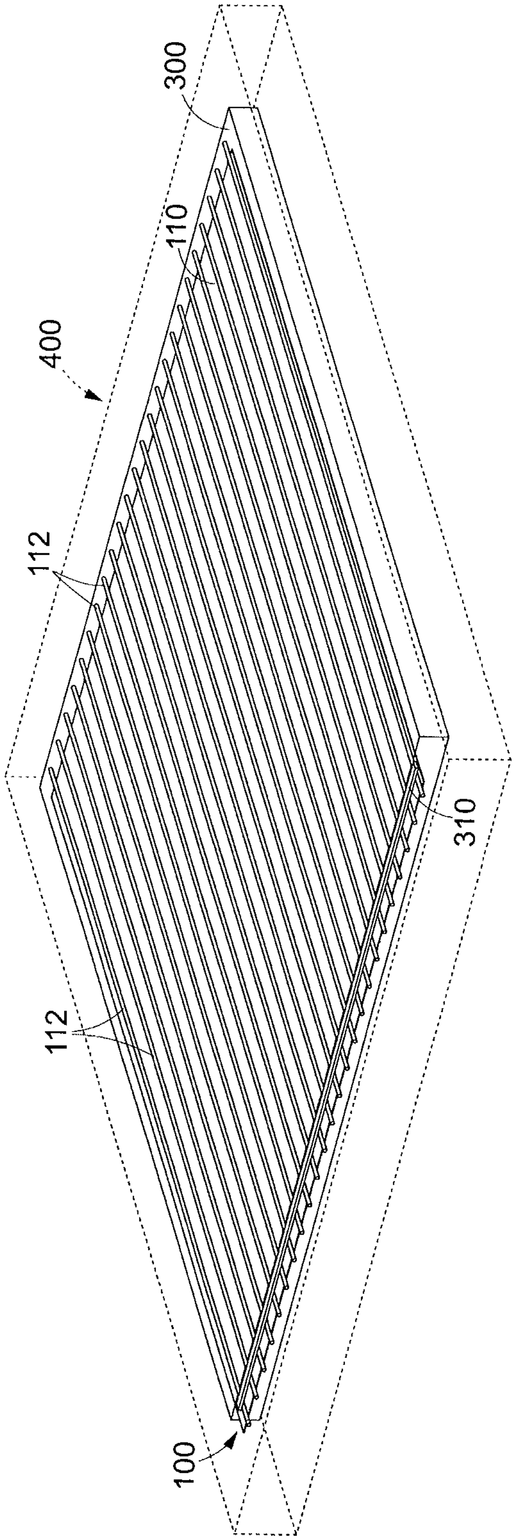
FIG. 9 is a perspective view of a photovoltaic module in accordance with some embodiments described here.

With reference to FIGS. 1-5, these show a machine 10 for producing an electrode 100, which is shown in detail in FIGS. 6-8, 8*a* and FIG. 5*c*, which is applied onto at least one photovoltaic cell 300, FIG. 9, or is used to electrically connect two or more photovoltaic cells 300 to each other in order to produce a photovoltaic module 400.

The electrode 100 comprises a support layer 110, an adhesive layer 111 supplied on a surface for positioning the support layer 110, and a plurality of conductive wires or filaments 112 substantially parallel to each other, glued onto the adhesive layer 111.

Optionally, other conductive wires 112 can be applied across the first conductive wires 112 to create a checkerboard or mesh layout.

The conductive wires 112 can be equidistant or they can be distanced in a non-uniform way, also depending on the type and size of the cell onto which the electrode 100 is to be subsequently applied. In the example described here, the conductive wires 112 are distanced from each other by a substantially uniform pitch P, see for example FIGS. 6-7.

The conductive wires 112 are substantially tangent to the surface of the adhesive layer 111 which can be cold-activated, as visible in FIGS. 8 and 8*a*.

The adhesive layer 111 can, for example, consist of a water-based glue with PSA (Pressure Sensitive-Adhesive) system. Additional types of glues can be solvent-based or with UV light polymerization.

In particular, and as will be detailed below, conductive wires 112 are cold-glued onto the adhesive layer 111, that is, without heat being used to activate the adhesive layer 111.

The conductive wires 112 can have a metal core, for example made of copper, and a coating made of a low melting point alloy. The conductive wires 112 can have a cross-section of any shape whatsoever although, for simplicity, only conductive wires 112 with a circular cross-section are shown in the attached drawings.

The support layer 110 can be made with a transparent polymer which also has a low melting point, in particular lower than that of the coating of the conductive wires 112.

The electrode 100 therefore comes in the form of a transparent or partly transparent membrane or film comprising the plurality of conductive wires 112 disposed distanced and parallel to each other.

The thickness of the adhesive layer 111 is smaller, by two orders of magnitude, than the thickness of the conductive wires 112 and is smaller, by one order of magnitude, than the thickness of the support layer 110. In this specific case, the thickness of the support layer 110 can be comprised between about 10 μm and about 50 μm, for example about 35 μm. The thickness of the adhesive layer 111 is about 1-2 μm. The thickness of the conductive wires 112 is comprised between about 100 μm and about 300 μm, for example about 250 μm.

Figure 2:
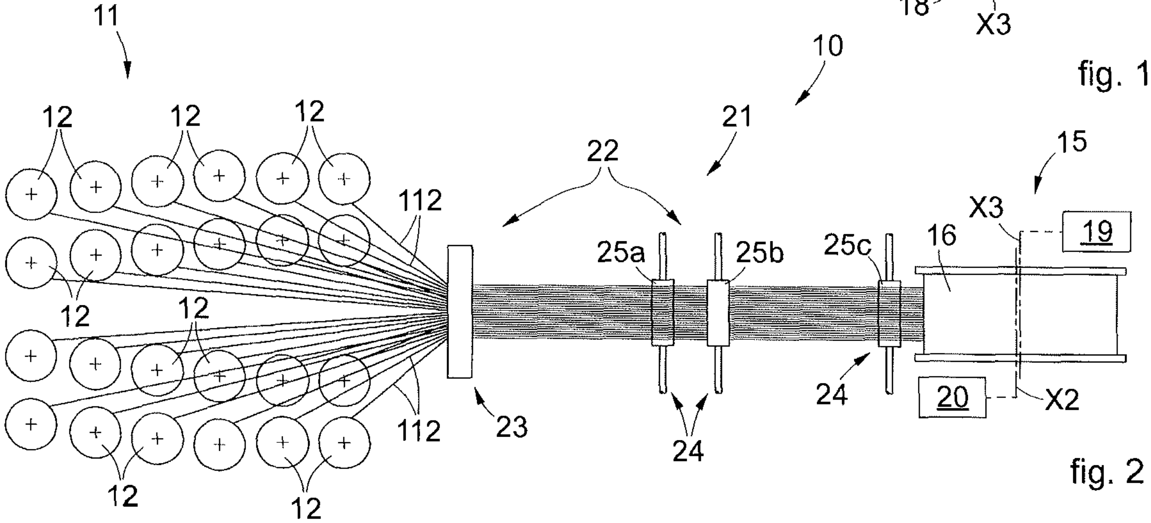
FIG. 2 is a top view of FIG. 1.

FIGS. 1-2 show a schematic illustration of the machine 10 for producing the electrode 100, which is cold-produced, that is, without any heating of the materials that constitute it, in the form of a continuous strip and packaged into reels. The electrode 100 is a continuous band which, when extended, has a substantially rectangular shape.

The machine 10 comprises a feed station 11 having a plurality of supports, or coils, 12 onto which respective conductive wires 112 are wound, which are able to be pulled in a direction of feed F.

The supports 12 can all be disposed on the same plane or, as in the case described here, on different planes, and they are rotatable in an idle way to allow the conductive wires 112 to be unwound. The axes of rotation of the supports 12 can be vertical, horizontal or inclined.

The machine 10 also comprises an assembly station 15 disposed downstream of the feed station 11 and comprising at least a first reel 16, onto which there is wound a first continuous multilayer strip S1 which comprises at least the support layer 110 and the adhesive layer 111.

Figure 5:
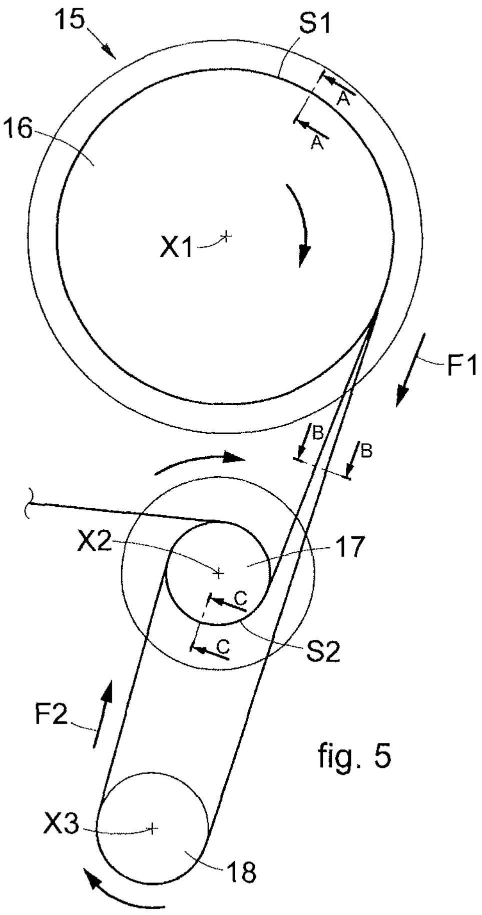
FIG. 5 shows an enlarged view of the assembly station of the machine of FIGS. 1-2.
Figure 5A:
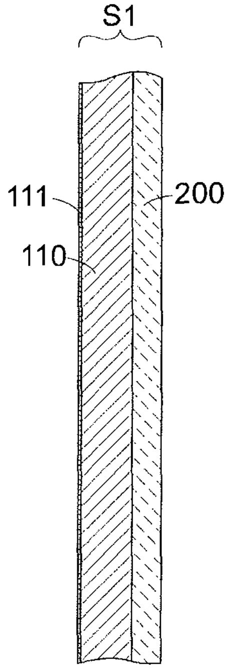
FIGS. 5A, 5B, 5C are enlarged section views respectively along the section lines A-A, B-B, C-C of FIG. 5.
Figure 5B:
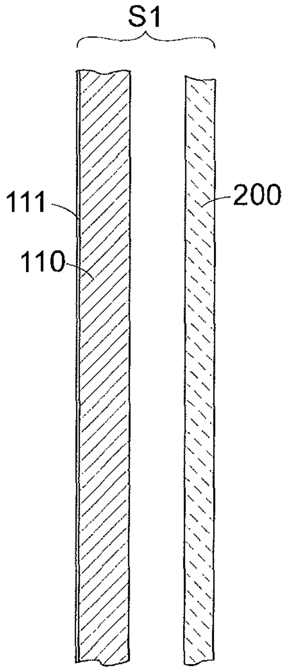
Figure 5C:
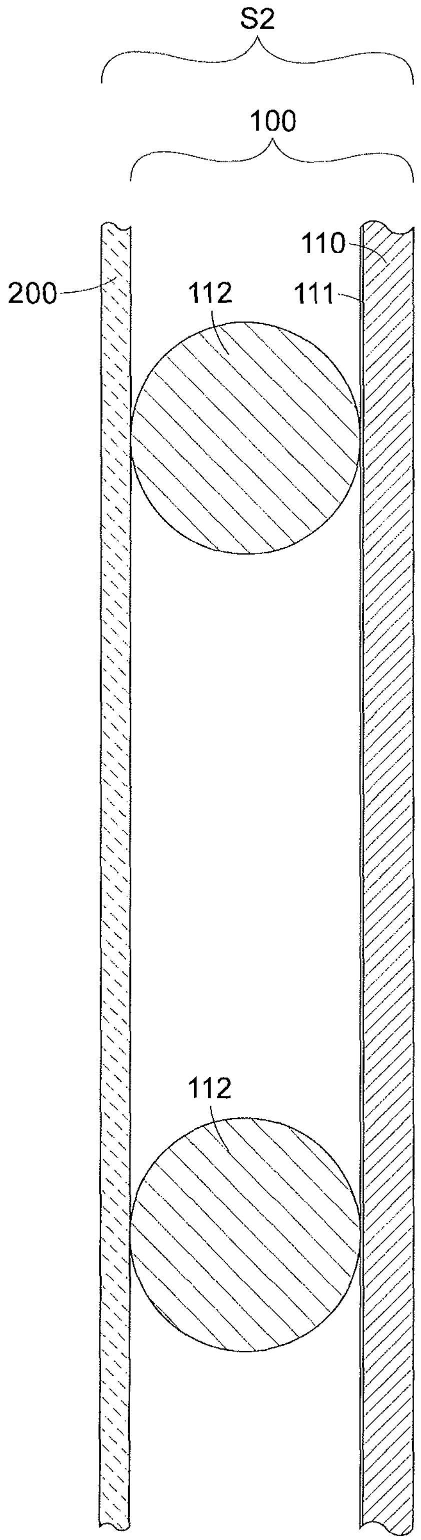
Figure 6:
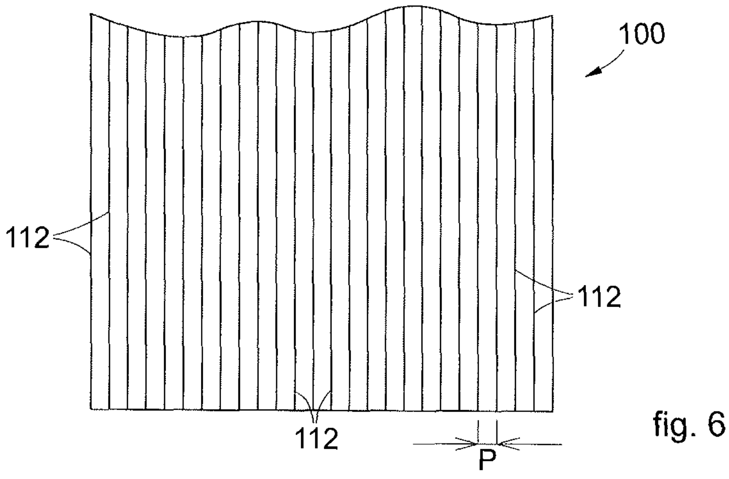
FIG. 6 is a top view of an electrode produced with the machine of FIGS. 1-2.
Figure 7:
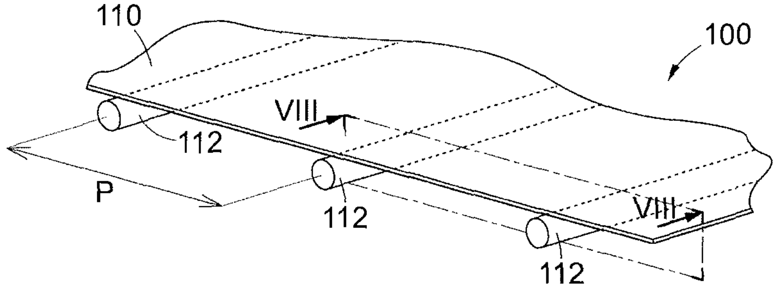
FIG. 7 is an enlarged detail, in a three-dimensional view, of the electrode of FIG. 6.

With particular reference to FIG. 5A, the first multilayer strip S1 can also comprise a protective layer 200 opposite the support layer 110 with respect to the adhesive layer 111. The protective layer 200 can, for example, comprise mono-siliconized paper.

The assembly station 15 also comprises at least a second reel 17 onto which the conductive wires 112 and the continuous multilayer strip S1 are able to converge in order to form the electrode 100.

In this specific case, a second continuous multilayer strip S2 is formed on the second reel 17 comprising the electrode 100 and the protective layer 200 which is disposed on the side of the conductive wires 112. In the second continuous multilayer strip S2, the conductive wires 112 are therefore located disposed sandwiched between the adhesive layer 111 and the protective layer 200, FIG. 5C.

In one embodiment, not shown, the protective layer 200 can be supplied on another reel different from the first reel 16, and it can be able to converge toward the second reel 17 in order to form the continuous multilayer strip S2.

The protective layer 200 is not part of the electrode 100, but has the function of improving the quality of the winding of the second continuous multilayer strip S2, facilitating its unwinding and making it easier to apply the electrode 100 onto photovoltaic cells.

The assembly station 15 also comprises a return roller 18 able to return the band of protective layer 200 arriving from the first reel 16 toward the second reel 17 in a second direction F2 opposite a first direction F1 with respect to which the band formed by the support layer 110 and by the adhesive layer 111 is able to be pulled by the second reel 17, see FIG. 1 and FIG. 5.

In the example described here, the second reel 17 is located at an intermediate height between the first reel 16 and the roller 18. However, other reciprocal configurations/dispositions of the first reel 16, the second reel 17 and the roller 18 are not excluded.

The first reel 16, the second reel 17 and the roller 18 are able to rotate in the same sense of rotation around respective axes of rotation X1, X2, X3 which are parallel to each other. The axes of rotation X1, X2, X3 can be aligned so as to lie on a single plane, or they can be offset.

The first reel 16 is connected to a first drive member 19 which acts as a clutch. In particular, the first drive member 19 serves to avoid the flywheel effect to which the first reel 16 could be subjected, FIGS. 1-2.

The second reel 17 is driven by a second drive member 20 which has a traction function to allow the winding of the second multilayer strip S2 onto the second reel 17, FIGS. 1-2.

The roller 18 is idle and rotates due to the effect of the traction that the second reel 17 exerts on the protective layer 200. The protective layer 200 contacts the roller 18 along an arc of adhesion of about 180°.

The machine 10 also comprises a distribution station 21 disposed between the feed station 11 and the assembly station 15, and comprising conveyor means 22 configured to suitably converge and distance from each other the conductive wires 112 arriving from the feed station 11.

The conveyor means 22 comprise one or more contrast devices 23 through which the conductive wires 112 converge and pass, and one or more spacing devices 24 configured to support the sliding of the conductive wires 112 and to distance one conductive wire 112 from the other by a determinate pitch P, according to the layout with which the conductive wires 112 are to be glued onto the adhesive layer 111.

The contrast devices 23 are disposed upstream of the spacing devices 24. However, it is also possible that contrast device 23 and spacing device 24 constitute a single component.

With particular reference to FIG. 1, there are two contrast devices 23 disposed distanced one above the other. For example, the conductive wires 112 of the group of supports 12 disposed higher pass through the contrast device 23 located at the top, while the conductive wires 112 of the group of supports 12 disposed lower pass through the contrast device 23 located at the bottom.

Figure 3:
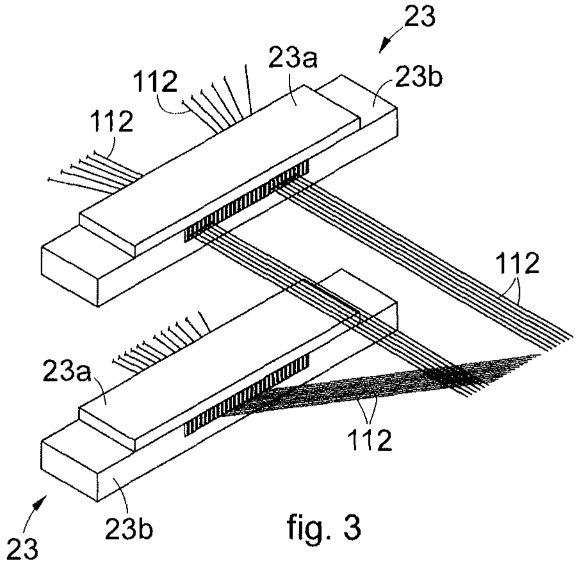
FIG. 3 and FIG. 4 show respective three-dimensional views of two components of the machine of FIGS. 1-2.

In the example of FIG. 3, each contrast device 23 is formed by two blocks 23*a*, 23*b* between which the conductive wires 112 can slide. The passage zone of the conductive wires 112 between the two blocks 23*a*, 23*b* can for example be configured as a comb or be provided with apertures or slits.

Figure 4:
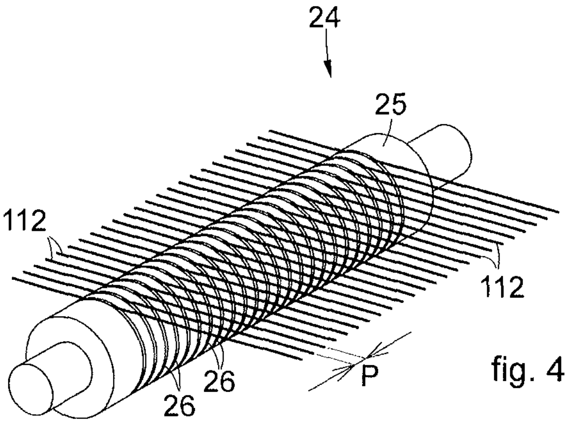

Each spacing device 24 comprises a grooved roller 25 provided with a plurality of throats 26 in a number at least equal to that of the conductive wires 112 which are fed and distanced by the same pitch P by which the conductive wires 112 have to be distanced on the electrode 100, FIG. 4.

The grooved roller 25 can rotate idly around an axis of rotation thereof, in such a way as to allow the conductive wires 112 to slide, limiting the friction caused by the sliding. The axis of rotation of the grooved roller 25 is parallel to the axes of rotation X1-X3 of the first reel 16, the second reel 17 and the roller 18.

With particular reference to FIGS. 1-2, the distribution station 21 comprises three spacing devices 24 disposed one in succession to the other in the direction of feed F.

The three spacing devices 24 keep the conductive wires 112 aligned with each other also in the vertical direction. In particular, the conductive wires 112 are tangent to an upper surface of a first and a third grooved roller 25*a*, 25*c*, and tangent to a lower surface of a second grooved roller 25*b* disposed between the first two.

The third grooved roller 25*c* is located near the second reel 17 in order to precisely guide the conductive wires 112 in the last segment, before they are glued onto the adhesive layer 111. In particular, the third grooved roller 25*c* is located at a distance from the second reel 17 such that there is no interference with the second multilayer strip S2 once this is completed.

In accordance with some embodiments, the method to produce the electrode 100 comprises at least:

- a feed step in which the plurality of conductive wires 112 which are wound onto respective supports 12 is pulled in the direction of feed F,
- an assembly step in which the first continuous multilayer strip S1, comprising at least the support layer 110 and the cold-activatable adhesive layer 111, is supplied onto the first reel 16 and is directed toward the second reel 17, to which the conductive wires 112 also converge, which are cold-glued by contact onto the adhesive layer 111 of the first continuous multilayer strip S1 in order to form, by winding, the electrode 100.

According to some embodiments, in the assembly step the first continuous multilayer strip S1 also comprises a protective layer 200 applied onto the adhesive layer 111. The protective layer 200 is temporarily separated from the adhesive layer 111 in order to allow the conductive wires 112 to be glued onto the latter and is subsequently closed on top of them in order to define, by winding, the second multilayer strip S2.

The method provides that the application of the conductive wires 112 onto the adhesive layer 111 occurs without the application of pressure, but only as a result of the contact between the wires and the glue that constitutes the adhesive layer 111. Another compaction of the elements that make up the electrode 100 occurs as a result of its winding onto the second reel 17.

In accordance with the embodiment of FIG. 9, a photovoltaic module 400 is provided, comprising at least one photovoltaic cell 300 onto which the electrode 100 is cold-applied.

There is also provided a method to produce the photovoltaic module 400, which comprises making available at least one photovoltaic cell 300 and cold-applying the electrode 100 onto the photovoltaic cell 300.

A conductive strip 310 can be applied onto the electrode 100, tangent to the conductive wires 112 and able to convey the electrical energy arriving from the conductive wires 112 toward the outside of the photovoltaic module 400, or toward a consecutive photovoltaic cell 300 (not shown).

As stated, the electrode 100 is cold-applied onto the at least one photovoltaic cell 300, this prevents the thermal shock traditionally generated by the application of a hot electrode—the support layer being at about 100° C.—onto the material at ambient temperature that makes up the photovoltaic cell 300, eliminating a passage that in any other stringing or method of adhesion between electrode and cell, has to be done hot.

It is clear that modifications and/or additions of parts or steps may be made to the electrode 100, and to the machine 10 and method for producing said electrode 100 as described heretofore, without departing from the field and scope of the present invention as defined by the claims.

In the following claims, the sole purpose of the references in brackets is to facilitate reading and they must not be considered as restrictive factors with regard to the field of protection claimed in the specific claims.

The invention claimed is:

1. A machine for producing an electrode, said machine comprising at least one feed station with a plurality of supports for respective conductive wires able to be unwound in a direction of feed and, downstream, comprising an assembly station with at least a first reel onto which a first continuous multilayer strip is wound, and a second reel onto which said conductive wires and said continuous multilayer strip are able to converge in order to form, by winding, said electrode, where said first continuous multilayer strip includes a protective layer and at least one support layer with which there is associated an adhesive layer onto which said conductive wires are cold-glued and said support layer has a lower melting point than that of the coating of the conductive wires, wherein said assembly station also comprises a roller able to return a band of the protective layer arriving from said first reel toward said second reel in a second direction opposite a first direction with respect to which a remaining part of said first continuous multilayer strip is pulled by said second reel, wherein said at least one feed station, said first reel and said second reel are configured and arranged such that the conductive wires are disposed tangent to the surface of said adhesive layer when converged on said second reel and a second continuous multilayer strip is formed on said second reel comprising said electrode and said protective layer by sandwiching said conductive wires between the adhesive layer and the protective layer.

2. The machine as in claim 1, further comprising a distribution station disposed between said feed station and said assembly station and comprising conveyor means configured to suitably converge and distance said conductive wires with respect to each other.

* * * * *